(12) United States Patent
Watai et al.

(10) Patent No.: US 8,349,645 B2
(45) Date of Patent: Jan. 8, 2013

(54) MASK AND FILM FORMATION METHOD USING THE SAME

(75) Inventors: Miwa Watai, Sammu (JP); Kazuya Saito, Sammu (JP); Takashi Komatsu, Sammu (JP); Yusuke Mizuno, Sammu (JP); Atsushi Ota, Sammu (JP); Shunji Kuroiwa, Sammu (JP)

(73) Assignee: Ulvac, Inc., Chigasaki-Shi (JP)

( * ) Notice: Subject to any disclaimer, the term of this patent is extended or adjusted under 35 U.S.C. 154(b) by 62 days.

(21) Appl. No.: 13/124,953

(22) PCT Filed: Oct. 21, 2009

(86) PCT No.: PCT/JP2009/005517
§ 371 (c)(1),
(2), (4) Date: Apr. 19, 2011

(87) PCT Pub. No.: WO2010/047101
PCT Pub. Date: Apr. 29, 2010

(65) Prior Publication Data
US 2011/0207261 A1   Aug. 25, 2011

(30) Foreign Application Priority Data
Oct. 21, 2008   (JP) ................................ 2008-271222

(51) Int. Cl.
*H01L 31/18* (2006.01)
*B05C 11/00* (2006.01)

(52) U.S. Cl. .............. 438/98; 438/57; 438/61; 438/942; 118/505; 257/E31.124

(58) Field of Classification Search .................... 438/57, 438/61, 98; 118/505; 257/E31.124
See application file for complete search history.

(56) References Cited

U.S. PATENT DOCUMENTS

| | | | | |
|---|---|---|---|---|
| 6,878,209 B2 * | 4/2005 | Himeshima et al. | .......... | 118/720 |
| 2003/0221614 A1 | 12/2003 | Kang et al. | | |
| 2008/0026543 A1 * | 1/2008 | Miyairi et al. | ................ | 438/455 |
| 2011/0259392 A1 * | 10/2011 | Lee et al. | ..................... | 136/244 |

FOREIGN PATENT DOCUMENTS

| | | |
|---|---|---|
| CN | 1518399 | 8/2012 |
| JP | 2000-133828 | 5/2000 |
| JP | 2004-14513 | 1/2004 |
| JP | 2004-91830 | 3/2004 |
| JP | 2007-181904 | 7/2007 |

OTHER PUBLICATIONS

International Search Report from corresponding PCT Application No. PCT/JP2009/005517 dated Jan. 26, 2010.
Office Action from corresponding Chinese Application No. 200980133226.6 dated Sep. 5, 2012. English translation attached.

* cited by examiner

*Primary Examiner* — Angel Roman
(74) *Attorney, Agent, or Firm* — Grossman, Tucker, Perreault & Pfleger, PLLC

(57) ABSTRACT

A mask includes: a tabular first section which includes a side portion and an opening portion formed at a position corresponding to a film formation region of a substrate and on which the substrate is to be disposed so that the first section overlaps a face of the substrate on which a film is to be formed; and a second section which is provided along the side portion of the first section, and covers at least one of portions of a side face of the substrate, wherein second sections of two adjacent masks overlap each other and a superposed section is thereby formed when a plurality of masks are arrayed in a lateral direction thereof.

6 Claims, 12 Drawing Sheets

MASK AND FILM FORMATION METHOD USING THE SAME

CROSS-REFERENCE TO RELATED APPLICATIONS

This is the U.S. National Phase Application under 35 U.S.C. §371 of International Patent Application No. PCT/JP2009/005517 filed Oct. 21, 2009, which designated the United States and was published in a language other than English, which claims the benefit of Japanese Patent Application No. 2008-271222 filed on Oct. 21, 2008, both of them are incorporated by reference herein. The International Application was published in Japanese on Apr. 29, 2010 as WO2010/047101 A1 under PCT Article 21(2).

BACKGROUND OF THE INVENTION

1. Field of the Invention

The present invention relates to a mask and a film formation method using the mask.

2. Background Art

In recent years, in view of efficient use of energy, solar cells are more widely used than ever before.

As solar cells, a silicon based solar cell such as a silicon solar cell employing single-crystalline silicon, a polysilicon solar cell employing polysilicon layer, an amorphous silicon solar cell employing an amorphous silicon, and the like are known.

A silicon-series solar cell is constituted of a photoelectric converter in which, for example, a transparent electrode which serves as a top-face electrode and which is formed on a glass substrate and composed of TCO (transparent conductive oxide) or the like, a semiconductor layer (photoelectric conversion layer) which is formed on the top-face electrode and composed of silicon, and an Ag thin film which is formed as a back-face electrode are stacked in layers.

The semiconductor layer has a layered structure which is referred to as pin-junction in which a silicon film (i-type) is sandwiched between p-type and n-type silicon films, the silicon film (i-type) generating electrons and holes when receiving light.

Meanwhile, in the above-described solar cell, after the top-face electrode, the semiconductor layer, and the back-face electrode are stacked on the substrate in layers, the photoelectric converter is sealed using a sheet or the like having an insulation property, and a solar cell module is thereby formed.

Since a peripheral portion of the substrate serves as a region to which a sheet is adhered, it is necessary to ensure the adherence property or the sealing characteristics between the solar cell and the sheet, and it is preferable that the photoelectric converter be removed from the peripheral portion of the substrate.

As a method for removing the peripheral portion of the substrate, as shown in, for example, Japanese Unexamined Patent Application, First Publication No. 2007-181904, a method is known in which, after a photoelectric converter is formed over an entire face of substrate, a thin film of the photoelectric converter formed on the peripheral portion is polished and removed by use of a blasting material while protecting the photoelectric converter formed on the portion except for the peripheral portion of the substrate using a mask.

In order to prevent deformation or abrasion which is caused by the blasting material, the mask used in the foregoing method is constituted of a covering component covering the photoelectric converter formed at the region except for the peripheral portion of the substrate and a reinforcing component for increasing the strength of the covering component.

Additionally, as shown, for example, in Japanese Unexamined Patent Application, First Publication No. 2000-133828, a method is known in which a first mask is formed at the peripheral portion of the substrate having translucency where a transparent electrode (top-face electrode) composed of a ZnO film is undesirable to be formed on the peripheral portion of the substrate, a ZnO film is formed using the first mask, and the ZnO film is formed on only the region which is not covered with the first mask.

However, in Japanese Unexamined Patent Application, First Publication No. 2007-181904 described above, when the photoelectric converter which is adhered to the peripheral portion of the substrate is polished using a blasting material, the blasting material is scattered onto a substrate surface or a side face, and there is a problem in that the substrate surface or the side face is damaged.

Furthermore, the blasting material scattered to the inside of the mask, and there is a problem in that the photoelectric converter which is formed on the region other than a removal region is damaged.

If the photoelectric converter is damaged, in order to repair the damaged portion, a process for cleaning the damaged portion, applying a bias voltage to the portion, or the like is necessary in addition to a polishing process using a blasting material.

For this reason, manufacturing efficiency is significantly degraded.

Additionally, in the constitution of Japanese Unexamined Patent Application, First Publication No. 2000-133828, there is a concern that particles of a film forming material scattering in a film forming chamber scatters to the substrate surface or the side face when a film is formed.

When a metal material forming the back-face electrode adheres to, for example, a substrate surface, the transmissivity of sunlight is degraded, and the efficiency of a solar cell is degraded.

In addition, there is a problem in that the particles of the film forming material scattering to the top face side of the substrate are adhered to an inner wall surface of the film forming chamber.

As a result, a maintenance operation of a film forming chamber becomes complicated.

SUMMARY OF THE INVENTION

Consequently, the invention was made in order to solve the above problems, and has an object to provide a mask and a film formation method using the mask where the particles of the film forming material are prevented from being adhered to a non-film formation region of one face of the substrate (face on which a film is to be formed, first face), the particles of the film forming material are prevented from scattering to the other face or a side face of the substrate (non-film formation face, second face), and it is thereby possible to improve manufacturing efficiency.

In order to solve the above-described problem, a mask of a first aspect of the invention includes: a tabular first section which includes a side portion and an opening portion formed at a position corresponding to a film formation region of a substrate and on which the substrate is to be disposed so that the first section overlaps a face of the substrate on which a film is to be formed; and a second section which is provided along the side portion of the first section, and covers at least one of portions of a side face of the substrate.

In the mask of the first aspect of the invention, second sections of two adjacent masks overlap each other and a superposed section is thereby formed when a plurality of masks are arrayed in a lateral direction thereof.

With this configuration, it is possible to form a film on the substrate in a state where the mask is attached to the substrate, and the particles of the film forming material which scatter in the film forming chamber pass through the opening portion and adhere to a face of the substrate on which a film is to be formed.

For this reason, since it is possible to form a film on only the region of the substrate which is exposed to the opening portion (i.e., film formation region), it is possible to prevent the film forming material from adhering to a non-film formation region on the face of the substrate on which a film is to be formed.

Specifically, since the superposed section is formed by overlapping the second sections of two masks that are adjacent to each other when a plurality of the masks are arrayed, the particles of the film forming material which scatter in the film forming chamber cannot pass through the space between the two masks.

Because of this, since the particles of the film forming material are not intruded while passing through the space between the masks adjacent to each other, it is possible to suppress adherence of the particles of the film forming material to the substrate, the particles scattering to the side face of the substrate or a non-film formation face.

For this reason, it is not necessary to polish a film forming material, which scatters to the non-film formation region of the substrate, the side face of the substrate, or a non-film formation face and is adhered to the substrate, with a blasting material or the like in a conventional manner.

Therefore, since the substrate is not also damaged caused by the scattering of the blasting material, it is not necessary to perform cleaning of the substrate for repair.

Because of this, it is possible to provide a high performance solar cell in which it is possible to improve manufacturing efficiency thereof and the throughput thereof is improved.

In the mask of the first aspect of the invention, it is preferable that the superposed section have a protuberance portion extending from the second section toward a first direction and a recessed portion extending toward a second direction which is opposite to the first direction. When a plurality of the masks are arrayed in a lateral direction thereof, the protuberance portion and the recessed portion are mutually combined and overlap each other as seen from a normal line direction of the substrate.

Additionally, the superposed section includes the protuberance portion extending from the second section toward an end in the direction in which the masks are arrayed and the recessed portion extending toward a different end which is different from the end.

In the superposed section, the protuberance portion of the mask attached to one of the substrates is combined with the recessed portion of the mask attached to the other substrates positioned at an end side of said one of the substrates in the direction in which the masks are arrayed.

Consequently, in the superposed section, it is preferable that the protuberance portion and the recessed portion be arranged so as to overlap each other as seen from a normal line direction of the substrate.

With this configuration, since the protuberance portion of the mask extending toward the first direction and the recessed portion of the mask extending toward the second direction are disposed so as to overlap each other as seen from a normal line direction of the substrate, the second section of the mask which is disposed at a front position in the direction in which the substrate is transferred overlaps the second section of the mask which is disposed at a rear position so as to be combined with each other.

For this reason, a space penetrated in a normal line direction of the substrate does not occur between the mask which is placed at the front position and the mask which is placed at the rear position.

That is, since the space formed between the masks adjacent to each other is formed in a labyrinth shape, the particles of the film forming material which scatter in the film forming chamber and pass through the space is suppressed, and it is possible to reliably prevent the film forming material from adhering to the non-film formation face of the substrate.

In the mask of the first aspect of the invention, it is preferable that an insulating member be provided between two masks adjacent to each other in the superposed section.

With this configuration, since the insulating member is provided at the superposed section, it is possible to prevent a leakage current from being generated between two masks.

A film formation method of a second aspect of the invention includes: preparing a plurality of masks, each mask including: a tabular first section which includes a side portion and an opening portion formed at a position corresponding to a film formation region of a substrate and on which the substrate is to be disposed so that the first section overlaps a face of the substrate on which a film is to be formed; and a second section which is provided along the side portion of the first section, and covers at least one of portions of a side face of the substrate, second sections of two masks that are adjacent to each other overlapping each other when a plurality of masks are arrayed in a lateral direction thereof, and a superposed section being thereby formed; attaching the substrate to each of the masks; and continuously transferring a plurality of substrates to a film forming chamber, and thereby forming a film on the substrates.

In the film formation method of the second aspect of the invention, it is preferable that the superposed section includes a protuberance portion extending in a first direction from the second section and a recessed portion extending in a second direction opposite to the first direction. When a film is formed on a plurality of the substrates, a plurality of the masks are arrayed in a lateral direction thereof, the protuberance portion and the recessed portion are mutually combined and overlap each other as seen from a normal line direction of the substrate.

In the film formation method of the second aspect of the invention, it is preferable that a photoelectric conversion layer of a solar cell be formed on the substrate, the mask be attached to each of the substrates on which the photoelectric conversion layer is formed, and a plurality of the substrates be continuously transferred to the film forming chamber, and a back-face electrode is formed on the photoelectric conversion layer of the substrates.

According to the method, it is possible to form a film on the substrate in a state where the mask is attached to the substrate, and the particles of the film forming material which scatter in the film forming chamber pass through the opening portion and adhere to a face of the substrate on which a film is to be formed.

For this reason, since it is possible to form a film on only the region of the substrate which is exposed to the opening portion (i.e., the film formation region), it is possible to prevent the film forming material from adhering to a non-film formation region on the face of the substrate on which a film is to be formed.

Specifically, since the superposed section is formed due to the second sections of two masks that are adjacent to each other overlapping with each other when a plurality of the masks are arrayed, the particles of the film forming material which scatter in the film forming chamber cannot pass through the space between the two masks.

Because of this, since the particles of the film forming material are not intruded while passing through the space between the masks adjacent to each other, it is possible to suppress adherence of the particles of the film forming material to the substrate, the particles scattering to the side face of the substrate or a non-film formation face.

For this reason, it is not necessary to polish a film forming material, which scatters to the non-film formation region of the substrate, the side face of the substrate, or a non-film formation face and is adhered to the substrate, with a blasting material or the like in a conventional manner.

Therefore, since the substrate is not also damaged caused by the scattering of the blasting material, it is not necessary to perform cleaning of the substrate for repair.

Because of this, it is possible to provide a high performance solar cell in which it is possible to improve manufacturing efficiency thereof and the throughput thereof is improved.

Effects of the Invention

According to the invention, it is possible to form a film on the substrate in a state where the mask is attached to the substrate, and the particles of the film forming material which scatter in the film forming chamber pass through the opening portion and adhere to a face of the substrate on which a film is to be formed.

For this reason, since it is possible to form a film on only the region of the substrate which is exposed to the opening portion (i.e., the film formation region), it is possible to prevent the film forming material from adhering to a non-film formation region on the face of the substrate on which a film is to be formed.

Specifically, since the superposed section is formed due to the second sections of two masks that are adjacent to each other overlapping with each other when a plurality of the masks are arrayed, the particles of the film forming material which scatter in the film forming chamber cannot pass through the space between the two masks.

Because of this, since the particles of the film forming material are not intruded while passing through the space between the masks adjacent to each other, it is possible to suppress adherence of the particles of the film forming material to the substrate, the particles scattering to the side face of the substrate or a non-film formation face.

For this reason, it is not necessary to polish a film forming material, which scatters to the non-film formation region of the substrate, the side face of the substrate, or a non-film formation face and is adhered to the substrate, with a blasting material or the like in a conventional manner.

Therefore, since the substrate is not also damaged caused by the scattering of the blasting material, it is not necessary to perform cleaning of the substrate for repair.

Because of this, it is possible to provide a high performance solar cell in which it is possible to improve manufacturing efficiency thereof and the throughput thereof is improved.

DESCRIPTION OF THE PREFERRED EMBODIMENTS

Next, a mask and a film formation method using the mask related to embodiment of the invention will be described with reference to drawings.

First Embodiment

Solar Cell

Figure 1:
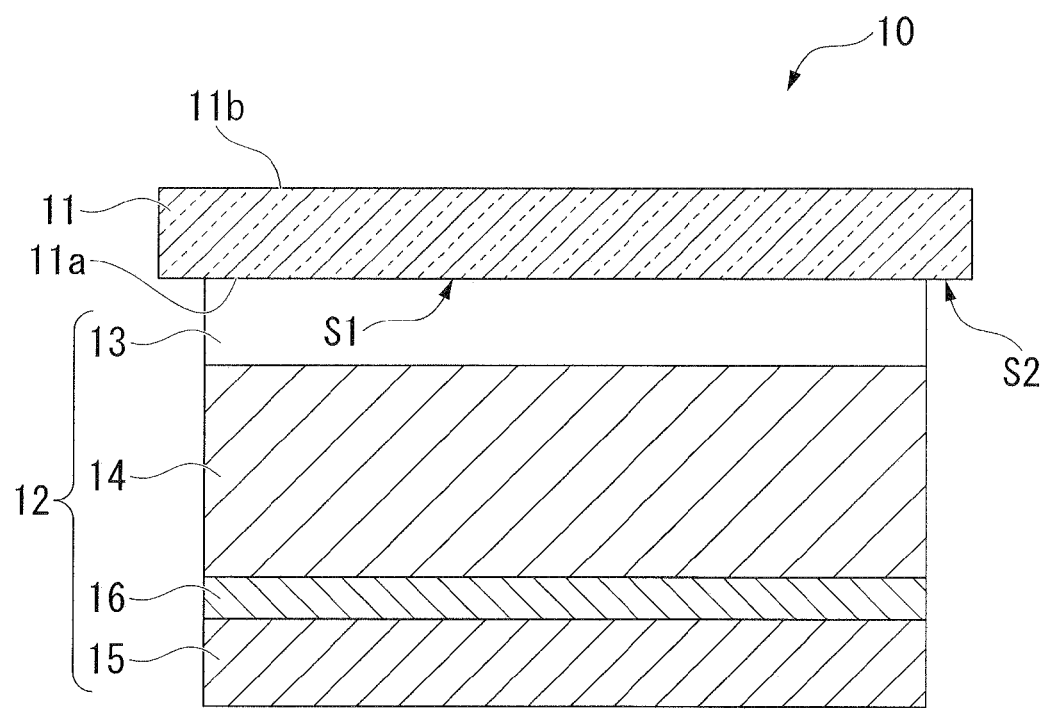
FIG. 1 is a cross-sectional view showing an amorphous silicon type solar cell of the first embodiment of the invention.

FIG. 1 is a cross-sectional view showing an amorphous silicon type solar cell.

As shown in FIG. 1, a solar cell 10 is a solar cell which is referred to as single type and in which a photoelectric converter 12 is formed on a face 11a (first face, face on which a film is to be formed) of a transparent substrate 11 having an insulation property.

Hereinafter, the face 11a of the substrate 11 is referred to as back face 11a.

The substrate 11 is formed of an insulation material having a high level of sunlight transparency and durability, such as a glass or a transparent resin.

Additionally, the substrate 11 of the embodiment is formed so as to be, for example, approximately one meter square.

Furthermore, the thickness of the substrate 11 is, for example, approximately 3 to 5 mm.

In the solar cell 10, sunlight is incident to the opposite side of the back face 11a on which the photoelectric converter 12 is formed, namely, the other face 11b (first face) of the substrate 11.

Hereinafter, the face 11b of the substrate 11 is referred to as a top face 11b.

The photoelectric converter 12 has a structure in which a semiconductor layer (photoelectric conversion layer) 14 is held between the top-face electrode 13 and the back-face electrode 15.

The photoelectric converter 12 is formed on the entire area of back face 11a except for the periphery of the back face 11a of the substrate 11.

In addition, on the back face 11a of the substrate 11, a region which is located at a central portion and on which the photoelectric converter 12 is formed is referred to as a film formation region S1, a region located at a peripheral portion an on which the photoelectric converter 12 is not formed is referred to as a non-film formation region S2.

The top-face electrode 13 is formed of a transparent conductive material, for example, a so-called TCO (transparent conductive oxide) such as GZO, ITO (Indium Tin Oxide), FTO (Fluorine doped Tin Oxide), or the like. The top-face electrode 13 is formed on the back face 11a of the substrate 11.

The semiconductor layer 14 is formed on the top-face electrode 13.

The semiconductor layer 14 has, a structure in which, for example, an i-type amorphous silicon film (not shown in the figure) is sandwiched between a p-type amorphous silicon film (not shown in the figure) and an n-type amorphous silicon film (not shown in the figure), that is, a pin-junction structure.

The semiconductor layer 14 is formed by stacking the p-type amorphous silicon film, the i-type amorphous silicon film, and the n-type amorphous silicon film in this order from the top-face electrode 13.

When sunlight is incident to the semiconductor layer 14 and energy particle included in sunlight is incident to the i-type amorphous silicon film, an electron and a hole are generated by the photovoltaic effect.

The electron moves toward the n-type amorphous silicon film, and the hole moves toward the p-type amorphous silicon film.

The foregoing electron and hole are obtained by the top-face electrode 13 and the back-face electrode 15, respectively, it is thereby possible to convert optical energy into electrical energy (photoelectric conversion).

The back-face electrode 15 is provided at the side opposite to the top-face electrode 13 with respect to the semiconductor layer 14 which serves as a center layer so that the semiconductor layer 14 is sandwiched between the top-face electrode 13 and the back-face electrode 15; and the back-face electrode 15 is stacked on the semiconductor layer 14 in layers.

The back-face electrode 15 is composed of a conductive metal film made of Ag, Cu, or the like or composed of an alloy including at least one of Ag, Cu, or the like as a main component.

Additionally, as a material of the back-face electrode, for example, an Ag film which is formed by use of the below-described film formation method of the invention is preferably employed.

The back-face electrode 15 has a function as a reflection layer that is used for reflecting sunlight passing through the semiconductor layer 14 and used for supplying the sunlight to the semiconductor layer 14 again.

Furthermore, a transparent electrode 16 made of TCO or the like is formed between the back-face electrode 15 and the semiconductor layer 14.

The transparent electrode 16 is an electrode used for improving a barrier property, a reflectance, or the like between the back-face electrode 15 and the semiconductor layer 14.

In other cases, it is preferable that the above-described photoelectric converter 12 have a texture structure in which micro uneven portions are formed at a light incident face side of the top-face electrode 13, but the structure is not shown in the figure.

In this case, it is possible to obtain a prismatic effect that the optical path of sunlight incident to each layer shown in FIG. 1 is extended and a light confining effect.

Because of this, it is possible to improve the conversion efficiency of the optical energy in the solar cell 10.

Moreover, a sheet (not shown in the figure) having an insulation property is formed on the photoelectric converter 12 so as to cover the photoelectric converter 12.

The sheet is used for protecting the photoelectric converter 12, covers the photoelectric converter 12, and is adhered to the substrate 11 at the peripheral portion of the substrate 11 (non-film formation region S2).

For this reason, a solar cell module is obtained in which the photoelectric converter 12 is sealed.

Sputtering Apparatus

Next, a sputtering apparatus of the embodiment (film formation apparatus) will be described.

Figure 2:
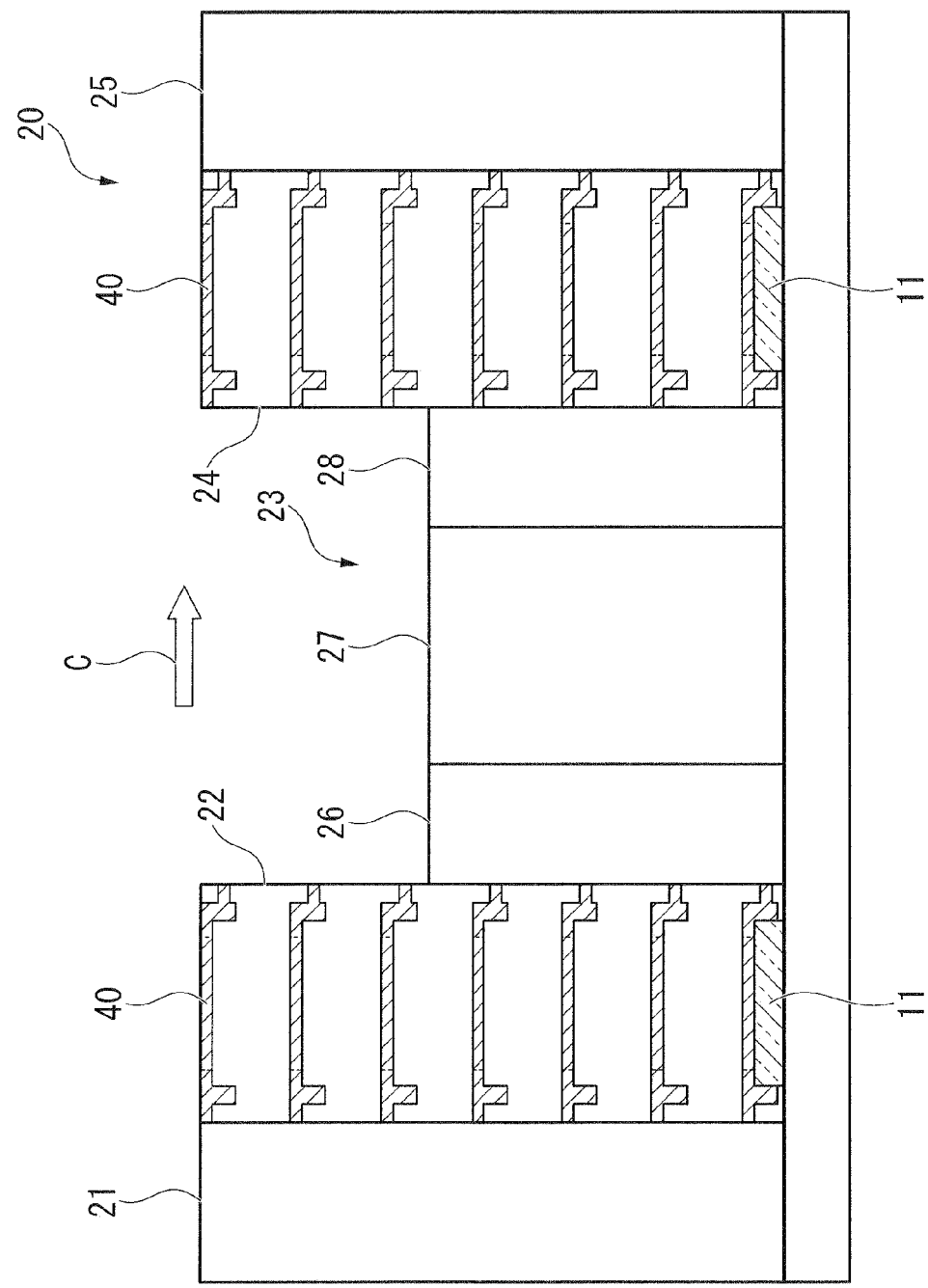
FIG. 2 is a block diagram schematically showing a sputtering apparatus of the first embodiment of the invention, and is a side view of the sputtering apparatus.

FIG. 2 is a schematic diagram (side view) schematically showing a sputtering apparatus.

Figure 3:
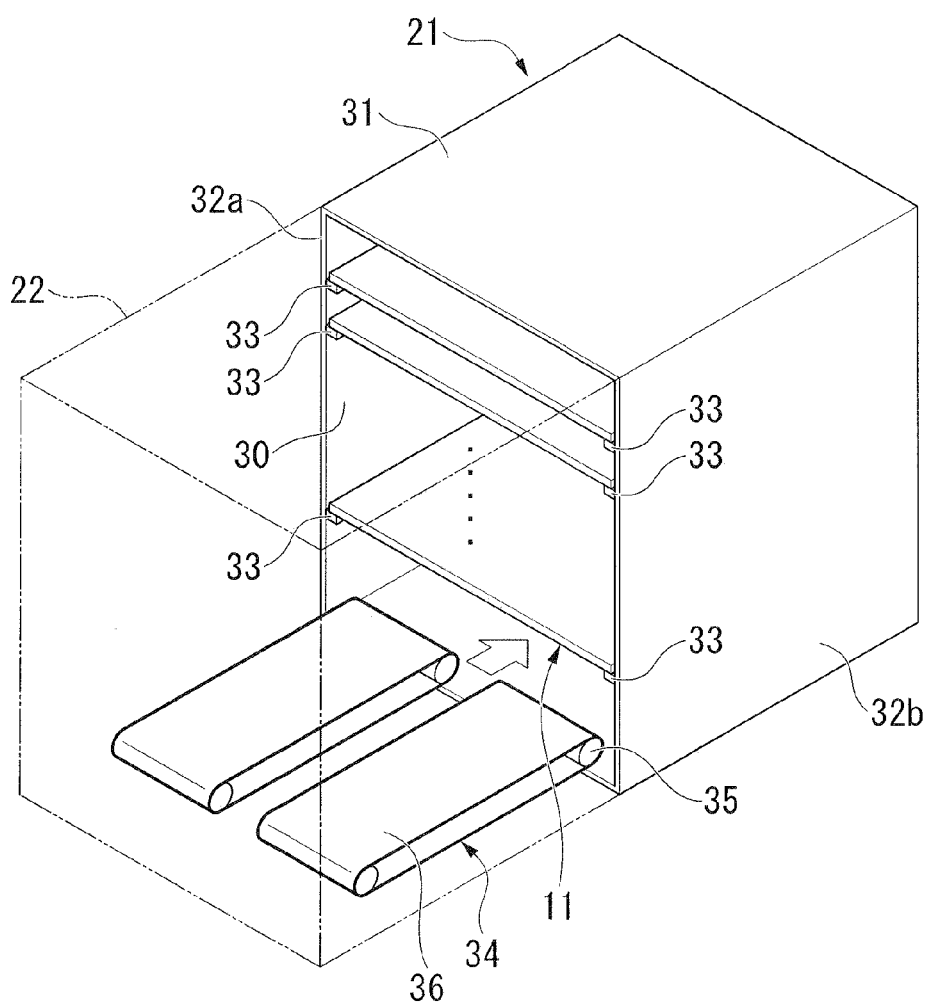
FIG. 3 is a perspective view showing a loading chamber of the sputtering apparatus of the first embodiment of the invention.

FIG. 3 is a perspective view showing a loading chamber in the sputtering apparatus.

As shown in FIG. 2, the sputtering apparatus 20 is a horizontal in-line type sputtering apparatus that transfers the substrate in a state where the substrate 11 is maintained in a horizontal direction (a direction perpendicular to a direction of gravitational force).

In a film forming chamber 27 described below, the transparent electrode 16 and the back-face electrode 15 in the above-described photoelectric converter 12 (refer to FIG. 1) are formed on the substrate in order.

In the sputtering apparatus 20, a loading chamber 21, a vacuum transfer system 23, and an unloading chamber 25 are arrayed in order along a transfer direction (direction indicated by arrow C in FIGS. 2, 4, and 5A) from an upstream toward a downstream in a direction in which the substrate is transferred.

In addition, in the sputtering apparatus 20 of the embodiment, the substrate is transferred while the lateral direction of the substrate 11 coincides with the transfer direction.

In the explanation described below, "upstream" and "downstream" represent as the direction in which the substrate is transferred from the upstream side toward the downstream side; it will be simply referred to as upstream and downstream.

Additionally, the direction in which the substrate is transferred corresponds to a first direction of the invention.

Furthermore, the direction opposite to the direction in which the substrate is transferred corresponds to a second direction of the invention.

As shown in FIG. 3, the substrate 11 on which the top-face electrode 13 and the semiconductor layer 14 (refer to FIG. 1) are stacked in layers is held in the loading chamber 21.

The loading chamber 21 includes a substrate holder 31 formed in a box shape and having an opening portion 30.

The substrate holder 31 has side plate portions 32a and 32b opposed to each other.

A plurality of rails 33 are provided along the height direction of the substrate holder 31 at faces opposed to each other in the side plate portions 32a and 32b, that is, at the inner surface of the side plate portion 32a and at the inner surface of the side plate portion 32b.

The rails 33 provided at the side plate portion 32a and the rails 33 provided at the side plate portion 32b are provided at positions opposed to each other.

Additionally, the rails 33 provided at the side plate portion 32a protrude from the inner surface of the side plate portion 32a toward the side plate portion 32b.

The rails 33 provided at side plate portion 32b protrude from the inner surface of the side plate portion 32b toward the side plate portion 32a.

The foregoing rails 33 are provided at the side plate portions 32a and 32b so as to extend in a direction a belt conveyer mechanism 34 enters, that is, in the direction indicated by the arrow in FIG. 3.

By means of this structure, a plurality of rails 33 which are formed at the inner surfaces of the side plate portions 32a and 32b include a pair of rails which face each other.

Furthermore, a plurality of pairs of the rails 33 are arrayed along the height direction of the substrate holder 31.

A peripheral portion in the lateral direction of one substrate 11 is supported at an upper edge face of a pair of rails 33.

That is, a plurality of substrates 11 are held so as to be parallel to the upper face of the substrate holder 31 in the substrate holder 31.

The belt conveyer mechanism 34 is provided between the loading chamber 21 and a mask attachment chamber 22.

The belt conveyer mechanism 34 transfers the substrate 11 from the loading chamber 21 to the mask attachment chamber 22, and transfers the substrate 11 from the mask attachment chamber 22 to the loading chamber 21.

A belt 36 is winded at a plurality of rotatable roller 35 in the belt conveyer mechanism 34.

The belt conveyer mechanism 34 is movable between the loading chamber 21 and the mask attachment chamber 22 in the direction indicated by the arrow in FIG. 3.

The belt conveyer mechanism 34 transfers the substrate 11 to the mask attachment chamber 22 in a state where the substrate 11 is mounted on the belt 36 after the belt conveyer mechanism 34 enters to the substrate holder 31 and extracts substrate 11 from the substrate holder 31.

Returning to FIG. 2, the vacuum transfer system 23 is disposed between the loading chamber 21 and the unloading chamber 25 and is connected to a gate valve or the like (not shown in the figure).

In the vacuum transfer system 23, the mask attachment chamber 22, a load chamber 26, the film forming chamber 27, an unload chamber 28, and a mask removal chamber 24 are arrayed in order from the upstream toward the downstream.

A vacuum pump (not shown in the figure) is connected to the mask attachment chamber 22, the load chamber 26, the film forming chamber 27, the unload chamber 28, and the mask removal chamber 24, and a vacuum atmosphere is maintained in each chamber.

The mask attachment chamber 22 is a chamber in which a mask 40 described below is attached to the substrate 11 that was transferred from the loading chamber 21.

A plurality of masks 40 are held along the height direction of the mask attachment chamber 22 in the mask attachment chamber 22.

In the mask attachment chamber 22, the mask 40 is attached to the substrate 11 that was transferred from the loading chamber 21 in which an air atmosphere is maintained.

After the mask 40 is attached to the substrate 11, the pressure of the mask attachment chamber 22 is reduced, the substrate 11 is received from the mask attachment chamber 22 to the load chamber 26.

The load chamber 26 is connected to the downstream of the mask attachment chamber 22 via a gate valve or the like.

At the stage previous to transferring of the substrate 11 to which the mask 40 is attached to the film forming chamber 27, the load chamber 26 functions as an inlet zone (inlet chamber) of the film forming chamber 27.

The film forming chamber 27 is connected to the load chamber 26 via a gate valve or the like.

In the film forming chamber 27, the substrate 11 transferred from the load chamber 26 are continuously transferred in a state where the back face 11a faces in an upper direction and in a state where the substrate 11 is maintained in the horizontal direction by a transfer roller or the like (not shown in the figure).

The sputtering apparatus 20 of the embodiment which is not shown in the figure is an apparatus sequentially forming the transparent electrode 16 and the back-face electrode 15 as described above.

In the sputtering apparatus 20, the film forming chamber 27 is separated into two chambers by a gate valve or a slit or the like.

In this case, the transparent electrode 16 made of TCO or the like is formed in an upstream chamber of the film forming chamber 27.

The back-face electrode 15 made of Ag or the like is formed in a downstream chamber in the film forming chamber 27.

In addition, a plurality of sputtering cathodes (not shown in the figure) are arrayed along the transfer direction of the substrate 11 so as to be substantially parallel to the back face 11a of the substrate 11 (horizontal type) at an upper portion of the film forming chamber 27.

Targets (not shown in the figure) that are constituent materials of the transparent electrode 16 and the back-face electrode 15 is attached to each of a plurality of sputtering cathodes.

The sputtering cathode is connected an external power source (not shown in the figure) and maintains a negative electrical potential.

A gas supply unit is provided near the sputtering cathode, and the gas supply unit supplies gases whose flow rates or mixture ratio are controlled to the film forming chamber 27.

The gas supply unit supplies an inert gas such as Ar or the like and a reactive gas such as $O_2$ or the like to the film forming chamber 27.

Specifically, in a case where the film forming chamber 27 is separated by a slit, that is, the film forming chamber 27 is separated into a downstream chamber and an upstream chamber, positions at which the gases introduced by the gas supply unit are different depending on types of gases.

Specifically, an inert gas is mainly introduced into a downstream chamber, that is, the chamber in which the back-face electrode 15 is formed.

Additionally, a reactive gas is mainly introduced into the upstream chamber, that is, the chamber in which the transparent electrode 16 is formed.

That is, by distancing back-face electrode 15 made of Ag or the like from a reactive gas supply source, it is possible to suppress the oxidation of the back-face electrode 15 even when a reactive gas is used.

Consequently, it is possible to prevent an electrical current obtained from the solar cell 10 from decreasing which is caused by the oxidation of the back-face electrode 15.

The unload chamber 28 is connected to the downstream of the film forming chamber 27 via a gate valve or the like.

The unload chamber 28 functions as an exit zone (exit chamber) of the film forming chamber 27 at the stage subsequent to the film forming chamber 27.

The unload chamber 28 receives the substrate 11, in which the top-face electrode 13, the semiconductor layer 14, the transparent electrode 16, and the back-face electrode 15 are formed in the structure shown in FIG. 1, from the film forming chamber 27.

In addition, the unload chamber 28 transmits the substrate 11 to the mask removal chamber 24.

The mask removal chamber 24 is connected to the downstream of the unload chamber 28 via a gate valve or the like.

The mask removal chamber 24 is a chamber in which the mask 40 attached to the substrate 11 transferred from the unload chamber 28 is removed.

In the mask removal chamber 24, a plurality of masks 40 removed from the substrate 11 are held along the height direction of the mask removal chamber 24.

The unloading chamber 25 has the same constitution as the constitution of the above-described loading chamber 21.

The unloading chamber 25 holds the substrate 11 transferred from the mask removal chamber 24.

Mask

Figure 4:
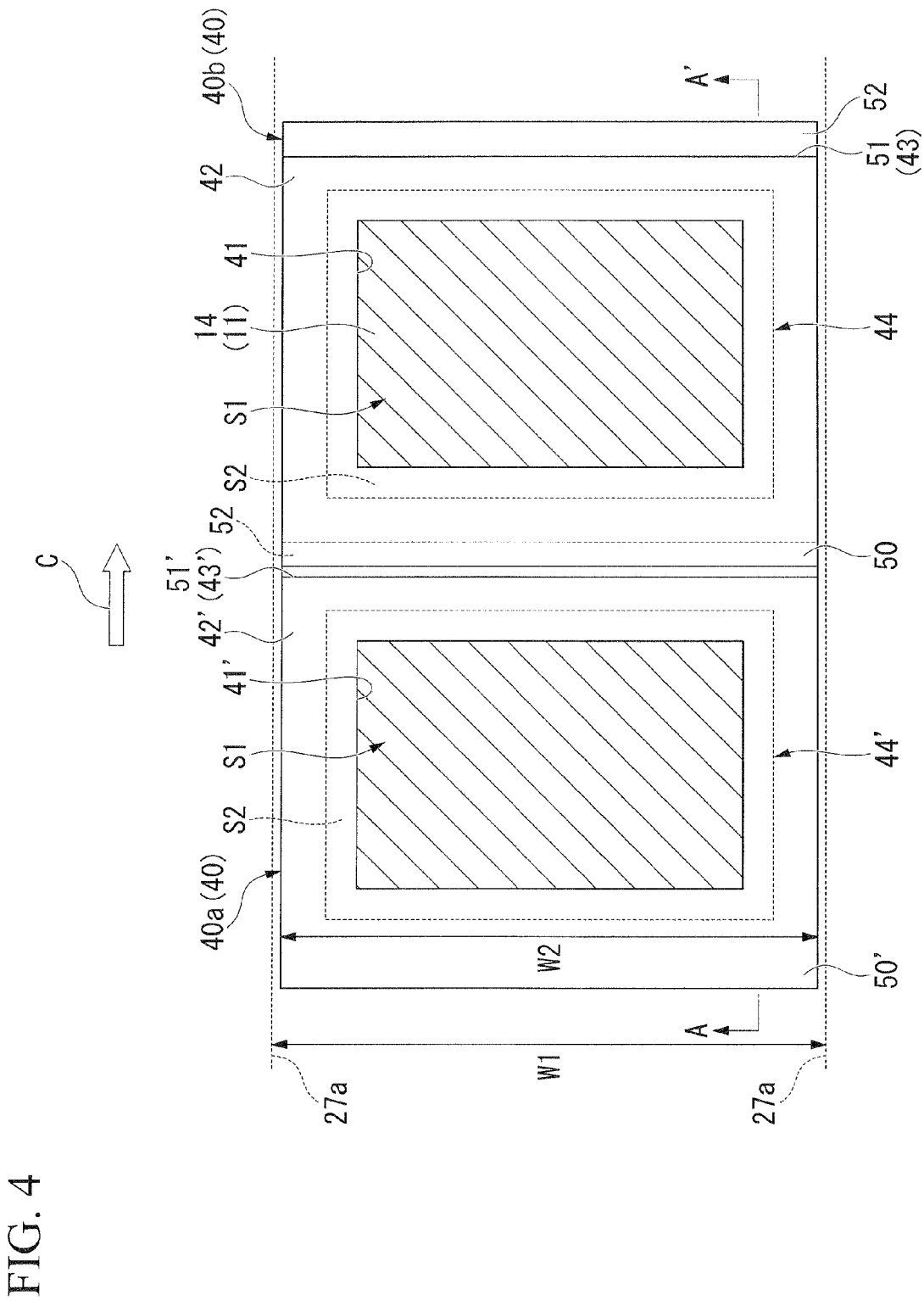
FIG. 4 is a plan view showing a mask used in a film forming chamber of the sputtering apparatus of the first embodiment of the invention.

FIG. 4 is a plan view showing a mask in the film forming chamber.

Figure 5A:
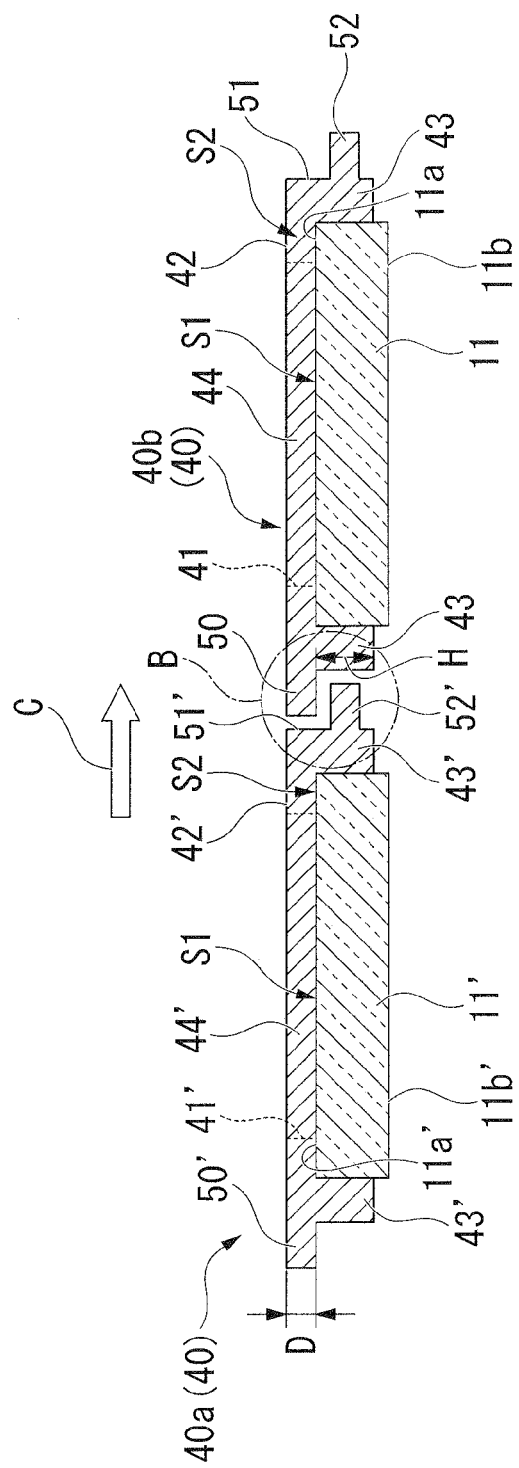
FIG. 5A is a cross-sectional view showing the mask used in the film forming chamber of the sputtering apparatus of the first embodiment of the invention, and a view taken along the line A-A' of FIG. 4.

FIG. 5A is a cross-sectional view taken along the line A-A' of FIG. 4.

Figure 5B:
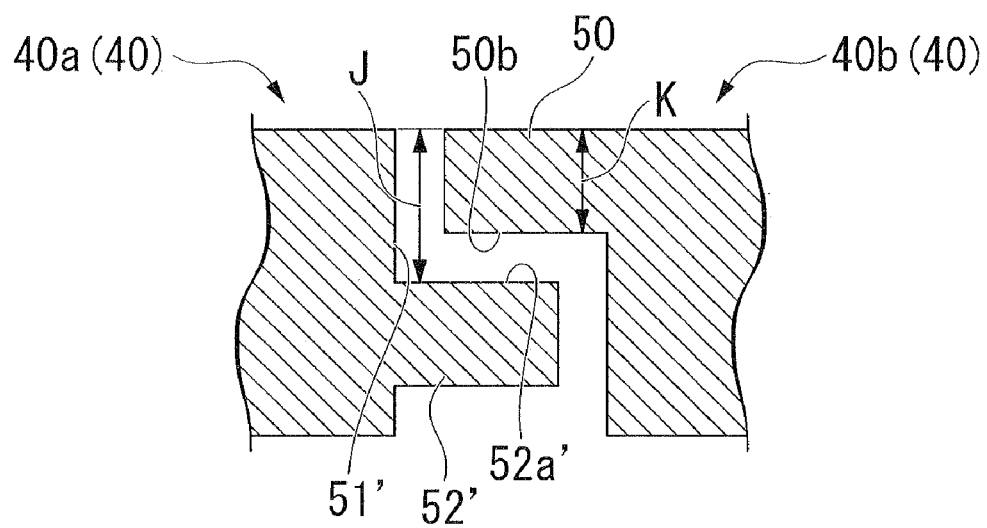
FIG. 5B is a cross-sectional view showing the mask used in the film forming chamber of the sputtering apparatus of the first embodiment of the invention, and is an enlarged cross-sectional view showing the constitution of a superposed section of the mask which is partially enlarged and indicated in FIG. 5A.

FIG. 5B is an enlarged view showing a portion (superposed section) indicated by reference numeral B in FIG. 5A.

In addition, arrow C indicated in FIGS. 4 and 5A represents a direction in which the substrate 11 is transferred.

Therefore, in each of FIGS. 4 and 5A, the left side represents the upstream side, and the right side represents the downstream side.

Furthermore, in FIG. 4, the position indicated by reference numeral 27a represents a position of an inner wall of the film forming chamber 27.

Additionally, the distance (width) between the inner walls opposed to each other in the film forming chamber 27 represents reference numeral W1.

As shown in FIGS. 4, 5A, and 5B, the above-described mask 40 has a tabular mask body 44 (first section) made of a metal such as SUS, Ti, Al, or the like; the back face 11a of the substrate 11 is covered with the mask 40.

Regarding the shape of the mask body 44, the external form of the mask body 44 is substantially the same as the shape of the substrate 11, and the mask body 44 has a tabular shape.

The mask body 44 is disposed so as to overlap a film formation face (back face 11a) of the substrate 11 when a film is formed.

The mask body 44 includes: an opening portion 41 formed at a central portion of the mask body 44; and an adhesion-preventing section 42 formed in the periphery of opening portion 41.

The opening portion 41 penetrates the mask body 44 in the thickness direction thereof.

The shape of the opening portion 41 as seen from the mask body 44 in the vertical direction thereof is a rectangular shape; and the opening portion 41 has the same surface area as the surface area of the film formation region 51 of the back face 11a of the substrate 11.

That is, the opening portion 41 is formed at the mask body 44 so that the particles of the film forming material which are discharged by sputtering the target of the above-described sputtering cathode passes through the opening portion 41 and so that the particles are formed on the back face 11a of the substrate 11.

The adhesion-preventing section 42 is provided so as to cover the non-film formation region S2 on the peripheral portion of the substrate 11.

The adhesion-preventing section 42 prevents the particles which are discharged by sputtering the target of the sputtering cathode from adhering to the non-film formation region S2.

Additionally, it is preferable that the thickness D of the mask body 44 be, for example, 0.5 mm or more.

If the thickness D of the mask body 44 is less than or equal to 0.5 mm, the weight of the mask 40 is too light.

Because of this, the position of the mask 40 is displaced from the position of the substrate 11 during the transferring of the substrate 11, and there is a concern that the mask 40 may be removed from the substrate 11, and the adhesion between the substrate 11 and the mask 40 is degraded and the mask 40 is not fixed to the substrate 11.

A peripheral wall 43 (second section) is formed at a side portion of the mask body 44 so as to surround the mask body 44.

At the side portion of the mask body 44, the peripheral wall 43 extends along the thickness direction of the mask body 44 from the face of the mask body 44 at which the substrate 11 is disposed.

The peripheral wall 43 extends to a middle portion in the thickness direction of the substrate 11 and is formed so as to surround the entire periphery of the side face of the substrate 11.

In other words, the height H of the peripheral wall 43, that is, the height H (distance in the vertical direction of the mask body 44) of the peripheral wall 43 extending from the side portion of the mask body 44 is less than the thickness of the substrate 11.

Additionally, the substrate 11 is covered with the peripheral wall 43 so that a portion of the side face of the substrate 11 is exposed.

Namely, as shown in FIG. 5A, the mask 40 is formed in substantially a U-shape in the cross section thereof.

The mask 40 configured as described above covers the region which is from the non-film formation region S2 of the back face 11a of the substrate 11 to the side face of the substrate 11.

In other cases, the thickness (height H) of the peripheral wall 43 may be greater than the thickness of the substrate 11.

A first extending section (protuberance portion) 50 extending toward the upstream along a top face of the mask body 44 is provided at the upstream of the peripheral wall 43, that is, at the side face (edge face) of the left side (one end side, first end) in FIGS. 4 and 5A.

The thickness of the first extending section 50 is equal to the thickness D of the mask body 44.

That is, the mask 40 is formed so that the upstream side face of the peripheral wall 43 protrude toward the upstream in the cross section thereof.

On the other hand, a step-difference section (recessed portion) 51 is formed at the downstream side of the peripheral wall 43, that is, at the side face (edge face) of the right side (the other end side, second end) in FIGS. 4 and 5A.

Additionally, a second extending section 52 is formed at the face of the peripheral wall 43 at which the step-difference section 51 is formed.

The second extending section 52 is provided at a middle portion in the thickness direction of the peripheral wall 43 formed at the mask body 44.

In other words, a step-difference section 51 is formed between the top face of the mask body 44 and the top face of the second extending section 52.

Additionally, the second extending section 52 horizontally extends from the side face of the peripheral wall 43 toward the downstream side, that is, toward the inverted direction relative to the extending direction of the above-described first extending section 50.

That is, as shown in FIG. 5B, the first extending section 50 and the second extending section 52' are disposed so that the position of the first extending section 50 is displaced from the position of the second extending section 52' in the normal line direction of the substrate 11 (thickness direction, direction perpendicular to the substrate face).

Specifically, the displacement amount J between the position of the second extending section 52' (top face position) and the position of the first extending section 50 (top face position) is greater than or equal to the thickness K of the first extending section 50.

Additionally, the first extending section 50 and the second extending section 52 extend in the direction perpendicular to the direction in which the substrate is transferred as shown in FIG. 4.

Moreover, as shown in FIG. 4, the width W2 of the mask 40 is slightly less than the distance W1 between the inner walls of the film forming chamber 27 in a direction orthogonal to the transfer direction of the substrate 11.

In other cases, a structure in which the first extending section (protuberance portion) 50 is formed at a downstream side face of the peripheral wall 43, and the second extending section 52 is formed at an upstream side face via the step-difference section (recessed portion) 51 may be employed.

Therefore, in the invention, the direction in which the substrate is transferred may be the second direction, and the direction opposite to the direction in which the substrate is transferred may be the first direction of the invention.

Here, the above-described masks 40 are continuously transferred along the direction indicated by arrow C in FIGS. 4 and 5A in a tandem arrangement in the film forming chamber 27 in a state where the mask 40 is attached to the substrate 11.

The mask 40 is used for preventing the film forming material from being adhered to the non-film formation region S2 of the substrate 11.

In a case where the masks 40 are attached to a pair of substrates 11 and 11' to be continuously transferred, respectively, the mask 40 (hereinafter, refer to mask 40a) attached to the substrate 11' of the upstream (rear side) of the film forming chamber 27 and the mask 40 (hereinafter, refer to mask 40b) attached to the substrate 11 of the downstream of the film forming chamber 27 are adjacent to each other along the transfer direction of the mask 40a.

Here, the masks 40a and 40b overlap to each other in the thickness direction as seen from the normal line direction of the substrates 11 and 11' in the masks 40a and 40b adjacent to each other.

Specifically, as shown in FIG. 5B, the top face of the second extending section 52' of the mask 40a (upper side, top face 52a'), namely, the step-difference section 51' is covered with the first extending section 50 of the mask 40b.

Additionally, the second extending section 52' is disposed under the back face side (lower side, lower face 50b) of the first extending section 50.

Because of this, the mask 40a and the mask 40b overlap so as to fit each other.

For this reason, a space penetrating in the normal line direction of the substrate 11 does not occur between the mask 40a and the mask 40b.

At this time, it is preferable that the second extending section 52' of the mask 40a and the first extending section 50 of the mask 40b are arranged in a state where the second extending section 52' and the first extending section 50 are not in contact with each other.

The gap between the mask 40a and the mask 40b is formed in a labyrinth shape so as to have a flex bending portion (bent portion).

In addition, both the masks 40a and 40b have substantially the same constitution.

Figure 6:
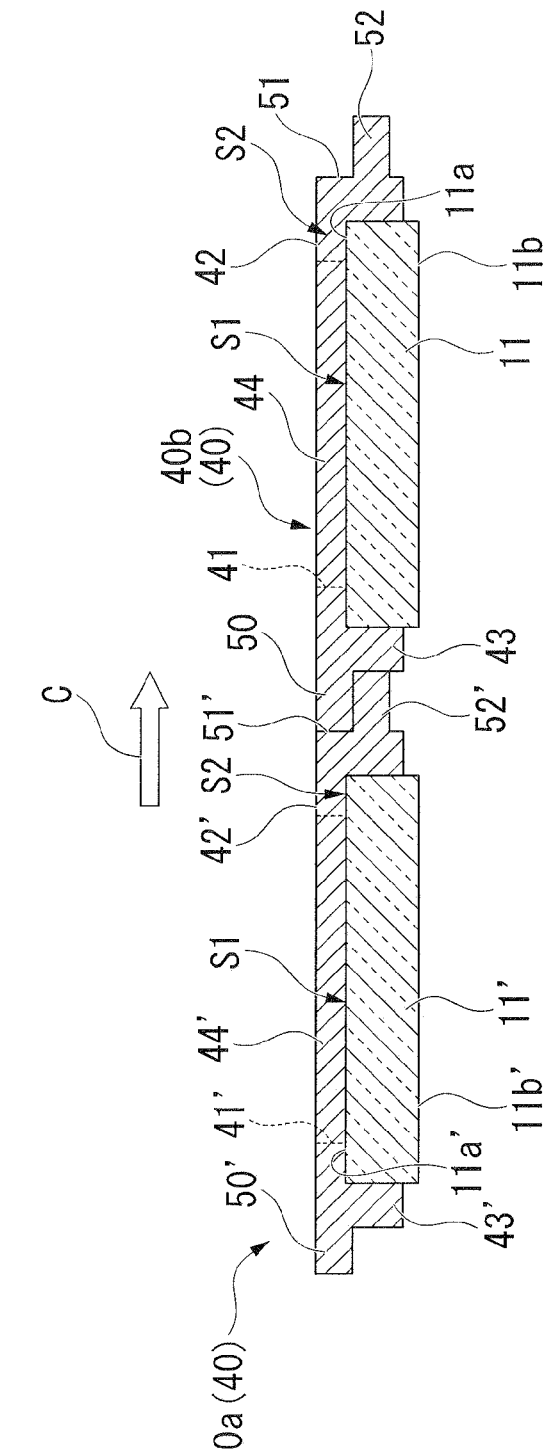
FIG. 6 is a cross-sectional view showing a modified example of the mask used in the film forming chamber of the sputtering apparatus of the first embodiment of the invention, and is a view taken along the line A-A' in FIG. 4.

FIGS. 4 to 6, for convenience, in a case where it is necessary to distinguish between the masks 40a and 40b, the substrate to which the mask 40a is attached is represented by substrate 11'.

Furthermore, the constituent elements of the mask 40a are represented by an opening portion 41', an adhesion-preventing section 42', the peripheral wall 43', the mask body 44', the first extending section 50', a step-difference section 51', and the second extending section 52'.

Additionally, in FIGS. 4 to 6, the portion at which the mask 40a and the mask 40b are in combination with each other, that is, the first extending section 50 of the mask 40a, the step-difference section 51 of the mask 40a, and the second extending section 52 of the mask 40a, the first extending section 50' of the mask 40b, the step-difference section 51' of the mask 40b, and the second extending section 52' of the mask 40b constitute a superposed section.

Film Formation Method

Next, a film formation method using the above-described sputtering apparatus will be described.

In addition, in the explanation described below, a case where the transparent electrode 16 and the back-face electrode 15 in the photoelectric converter 12 (refer to FIG. 1) are formed will be described.

Firstly, as shown in FIGS. 2 and 3, a substrate 11 is extracted from the substrate holder 31 of the loading chamber 21.

Specifically, the belt conveyer mechanism 34 is inserted into the opening portion 30 of the substrate holder 31, the belt 36 supports the substrate 11 which is held by the upper edge face of a pair of the rails 33 in the substrate holder 31.

Next, the belt conveyer mechanism 34 is removed from the substrate holder 31 and moves to the mask attachment chamber 22 in a state where the substrate 11 is supported on the belt 36.

Thereafter, the roller 35 rotates, and the substrate 11 is transferred to the mask attachment chamber 22.

Next, the mask 40 is attached to the substrate 11 which was transferred to the mask attachment chamber 22.

Specifically, the mask 40 which is held in the mask attachment chamber 22 lowers, and the mask 40 is attached to the substrate 11 so as to cover the back face 11a of the substrate 11.

Consequently, the film formation region 51 of the substrate 11 is exposed to the opening portion 41 of the mask 40, and a peripheral portion of the substrate 11 that is the non-film formation region S2 is covered with the adhesion-preventing section 42.

Thereafter, the substrate 11 to which the mask 40 is attached is transferred to the film forming chamber 27 via the load chamber 26.

When the substrate 11 is transferred to the film forming chamber 27, the transparent electrode 16 and the back-face electrode 15 are sequentially formed on the semiconductor layer 14 formed on the back face 11a of the substrate 11.

Specifically, a sputter gas or the like is supplied to the film forming chamber 27 from the gas supply unit, and a sputtering voltage is applied to the sputtering cathode from an external power source.

At this time, ions of the sputter gas energized by plasma in the film forming chamber 27 collide with a target of the sputtering cathode, and the particles of the film forming material are scattered from the target.

Due to the scattered particles being adhered to the film formation region 51 of the substrate 11, the transparent electrode 16 and the back-face electrode 15 are formed on the back face 11a of the substrate 11.

At this time, since a film is formed in a state where the substrate 11 is attached to the mask 40, the particles of the film forming material that are scattered in the film forming chamber 27 pass through the opening portion 41 and are deposited on the substrate 11.

Consequently, since it is possible to form a film on only the region of the substrate 11 which is exposed to the opening portion 41, it is possible to prevent a film forming material from adhering to the non-film formation region S2 of the substrate 11.

In an in-line type sputtering apparatus (sputtering apparatus 20) such as the embodiment, since the substrate 11 moves with respect to the sputtering cathode, it is possible to form a film on the entire surface of the substrate 11 with a uniform film quality.

Additionally, it is possible to continuously form a film on a plurality of substrates 11 by continuously transferring a plurality of substrate 11 to the film forming chamber 27.

Here, as shown in FIGS. 4 and 5A, the substrates 11 that are transferred to the film forming chamber 27 in a state where the substrate 11 is attached to the mask 40 are continuously transferred in the film forming chamber 27.

At this time, as shown in FIGS. 5A and 5B, the substrates 11' and 11 are transferred in a state where the first extending section 50 of the mask 40b overlaps the second extending section 52' of the mask 40a between the mask 40a attached to the upstream substrate 11' and the mask 40b attached to the downstream substrate 11 in the film forming chamber 27 as seen from the normal line direction the substrates 11 and 11'.

Specifically, the first extending section 50 of the mask 40b is disposed at the top face side 52a' of the second extending section 52' of the mask 40a, that is, so as to cover the step-difference section 51'; and the second extending section 52' is disposed so as to set under the back face side 50b of the first extending section 50.

That is, the second extending section 52' and the first extending section 50 are arranged so that the top face 52a' of the second extending section 52' face to the lower face 50b of the first extending section 50.

As described above, the substrates 11 and 11' are transferred in a state where the first extending section 50 of the mask 40b and the second extending section 52' of the mask 40a are stacked so as to combine with each other.

As a result, a space penetrating in the thickness direction does not occur between the mask 40a and the mask 40b.

At this time, it is preferable that the second extending section 52' of the mask 40a is not contact with the first extending section 50 of the mask 40b; and the gap between the mask 40a and the mask 40b is formed in a labyrinth shape.

Due to transferring the masks 40a and 40b in a state where the masks 40a and 40b are not in contact with each other, it is possible to prevent a leakage current from being generated between the masks 40a and 40b.

Additionally, in order to reliably prevent the leakage current from being generated, an insulation component formed in a small protuberance or a sheet shape may be disposed between the second extending section 52 and the first extending section 50.

Similarly, in order to prevent a leakage current from being generated between the mask 40 and the substrate 11, an insulation component may be disposed at the faces at which the mask 40 faces to the substrate 11.

Next, the substrate 11 on which the transparent electrode 16 and the back-face electrode 15 are formed is transferred from the film forming chamber 27 to the unload chamber 28.

Furthermore, the substrate 11 is transferred to the mask removal chamber 24 via the unload chamber 28.

In the mask removal chamber 24, the mask 40 is removed from the substrate 11.

The mask 40 removed from the substrate 11 is held in the mask removal chamber 24.

The substrate 11 that was removed from the mask 40 is transferred to the unloading chamber 25 by the belt conveyer mechanism 34.

Because of this, the photoelectric converter 12 is formed on only the film formation region S1 of the back face 11a of the substrate 11, that is, the central portion of the substrate 11.

As described above, in the above-described embodiment, the masks 40a and 40b that are adjacent to each other along the transfer direction in the film forming chamber 27 have the superposed section so that the masks 40a and 40b overlap each other in the thickness direction.

With this configuration, since the second extending section 52' of the mask 40a is disposed so as to overlap the first extending section 50 of the mask 40b as seen from the thickness direction of the substrates 11 and 11', the space penetrating in the thickness direction thereof at the position at which the mask 40a and the mask 40b are adjacent to each other does not occur.

Because of this, the particles of the film forming material scatter in the film forming chamber 27 cannot pass through the space between the masks 40a and 40b.

For this reason, since the particles of the film forming material are not intruded while passing through the space between adjacent masks 40a and 40b, the particles of the film forming material are not scattered to the space above the top face 11b while passing through the space formed between the masks 40a and 40b.

That is, it is possible to suppress adherence of the particles of the film forming material to the side face or the top face 11b of the substrate 11.

For this reason, it is not necessary to polish a film forming material, which is adhered to the non-film formation region S2 of the substrate 11, or the side face or the top face 11b of the substrate 11, with a blasting material or the like in a conventional manner.

Accordingly, since the substrate is not also damaged caused by the blasting material, it is not necessary to perform cleaning of the substrate 11 for repair.

Because of this, it is possible to provide a high performance solar cell 10 in which it is possible to improve manufacturing efficiency thereof and the throughput thereof is improved.

Additionally, even if there is the possibility that the particles of the film forming material are adhered to the side face of the substrate 11 while passing through the space between adjacent masks 40a and 40b, since the peripheral wall 43 surrounding the side face of the substrate 11 is formed at the mask body 44, it is possible to reliably prevent the film forming material from being adhered to the side face of the substrate 11.

Furthermore, as shown in FIG. 4, the width W2 in the direction orthogonal to the transfer direction of the mask 40 is slightly different from the width W1 of the film forming chamber 27, that is, an end portion of the mask 40 is adjacent to the inner wall of the film forming chamber 27 in the vicinity of the inner wall of the film forming chamber 27.

For this reason, in a planar view of the film forming chamber 27 (as seen from a normal line direction of the substrate 11), the space of film forming chamber 27 is covered with the mask 40.

Because of this, the scattering of the particles of the film forming material to the space above the top face 11b of the substrate 11 while passing through the space between the mask 40 and the inner wall of the film forming chamber 27 is suppressed.

Therefore, it is possible to prevent the film forming material from being adhered to the top face 11b or the side face of the substrate 11 in the film forming chamber 27.

As a result, it is possible to improve maintenance of the film forming chamber 27.

In addition, the technical scope of the invention is not limited to the above embodiments, but various modifications in the above-described embodiment may be made without departing from the scope of the invention.

Namely, constitutions or the like described in the above embodiment are examples, and modifications can be appropriately adopted.

For example, the invention may be applied to a method for forming the top-face electrode 13 on the back face 11a of the substrate 11.

In this case, the above-described mask is attached to the substrate 11 in which a film is not formed on the back face 11a, the back face 11a is exposed to the opening portion 41 of the mask, and the top-face electrode 13 is formed on the back face 11a.

Hereinafter, a modified example of the first embodiment and a second embodiment to an eleventh embodiment will be described.

In the modified example and second to eleventh embodiment, identical symbols are used for the elements which are identical to those of the first embodiment, and the explanations thereof are omitted or simplified.

Modified Example of First Embodiment

In the above-described embodiment, the case where the second extending section 52' of the mask 40a and the first extending section 50 of the mask 40b are transferred while not being in contact with each other is described.

In the invention, constituent may be applicable in which the second extending section 52' of the mask 40a and the first extending section 50 of the mask 40b are in combination with each other as shown in FIG. 6.

In this configuration, an end portion of the first extending section 50 of the mask 40b is in contact with the step-difference section 51' of the mask 40a, and the lower face 50b of the first extending section 50 is in contact with the top face 52a' of the second extending section 52'.

With this configuration, it is possible to reliably prevent the particles of the film forming material from scattering to the space above the top face 11b of the substrate 11 while passing through the space between the masks 40a and 40b.

Second Embodiment

In the invention, a configuration the opening portion of the mask may be appropriately modified.

For example, in cases of dividing the substrate so as to manufacture a plurality of solar cells after the photoelectric converter is formed on the substrate, a plurality of solar cells may be formed by preliminarily dividing an opening portion of the mask.

Figure 7:
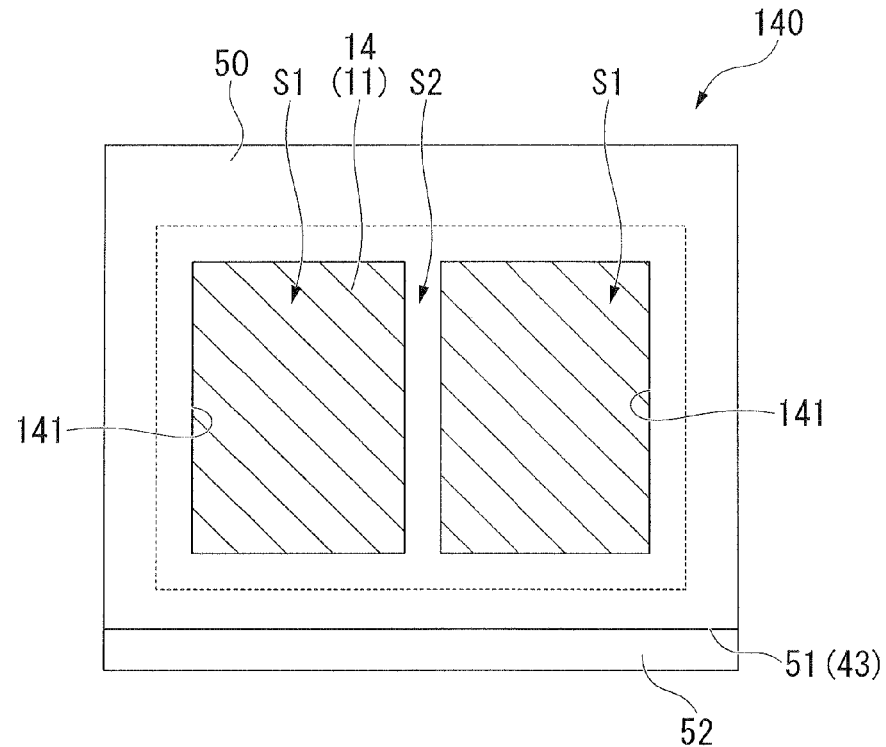
FIG. 7 is a plan view showing the constitution of a mask of a second embodiment of the invention.

Specifically, as shown in FIG. 7, two opening portions 141 may be formed on the mask 140.

In this case, regions between the opening portions 141 and 141 is divisional regions, and it is possible to prevent the film forming material from being adhered to a peripheral portion of the divided substrate 11.

Third Embodiment

Figure 8:
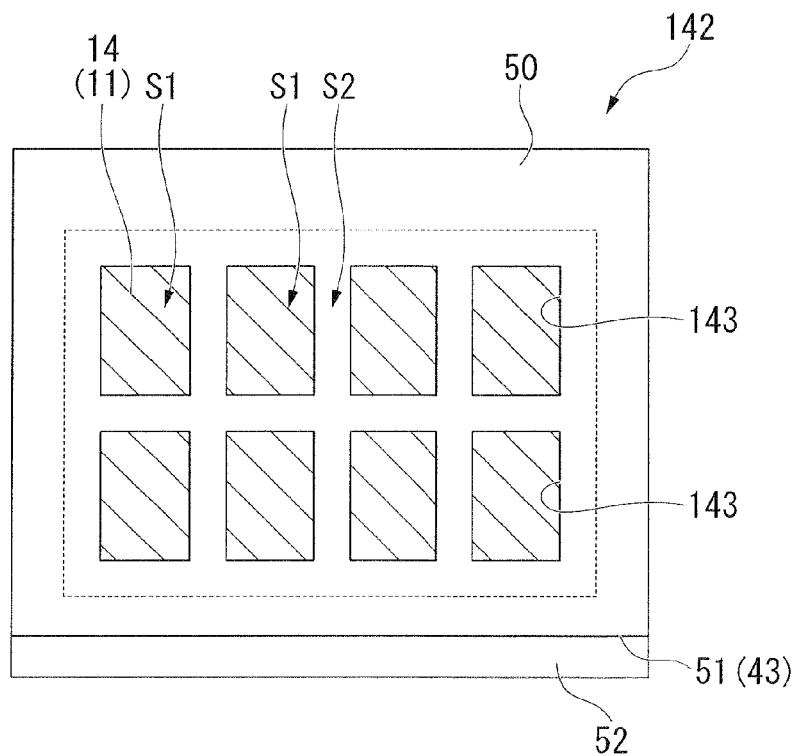
FIG. 8 is a plan view showing the constitution of a mask of a third embodiment of the invention.

Furthermore, as shown in FIG. 8, eight opening portions 143 may be formed on the mask 142.

Additionally, one mask may be attached to a plurality of substrates.

Fourth Embodiment

Furthermore, a configuration of the superposed section is not limited to the above-described embodiment, and can be appropriately modified to, for example, configuration or the like as described below.

Figure 9:
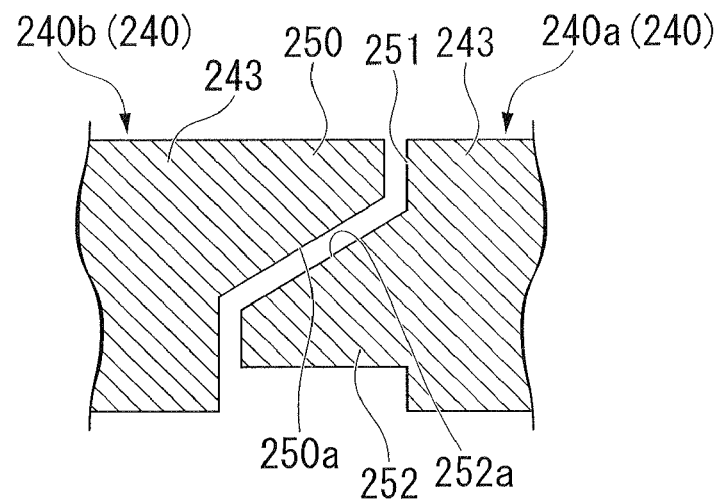
FIG. 9 is an enlarged cross-sectional view showing the constitution of a superposed section of a mask of a fourth embodiment of the invention.

As shown in FIG. 9, the superposed section is constituted of a first extending section (protuberance portion) 250 and a second extending section 252.

The first extending section (protuberance portion) 250 is formed at a downstream side face of a peripheral wall 243, has an upper face located along a top face of the mask 240, and extends from the downstream side face.

The second extending section 252 is formed at an upstream side face of the peripheral wall 243, and extends from the upstream side face of the peripheral wall 243 via a step-difference section (recessed portion) 251.

At the back face of the first extending section 250, an inclined face 250a is formed which is upwardly inclined from a base end that is the side face of the peripheral wall 243 toward a front-end of the first extending section 250.

That is, the first extending section 250 extends so that the thickness of the first extending section 250 becomes small in a manner so as to approach the front-end from the base end.

On the other hand, at the top face of the second extending section 252, an inclined face 252a is formed which is downwardly inclined from a base end that is the side face of the peripheral wall 243 toward a front-end of the second extending section 252.

That is, the second extending section 252 extends so that the thickness of the second extending section 252 becomes small in a manner so as to approach the front-end from the base end.

Consequently, when a plurality of masks 240 are arranged in the lateral direction thereof in a tandem arrangement, the second extending section 252 of the peripheral wall 243 constituting the mask 240a disposed at the front position (right side in FIG. 9) is in combination with the first extending section 250 of the peripheral wall 243 constituting mask 240b disposed at the rear position (left side in FIG. 9).

Therefore, the superposed section is formed and arranged so that the peripheral walls 243 of each of adjacent masks are stacked as seen from the thickness direction thereof.

With this configuration, the first extending section 250 and the second extending section 252 are formed so that the thicknesses thereof become small in a manner so as to approach the front-ends of the first extending section 250 and the second extending section 252; therefore, the first extending section 250 and the second extending section 252 are fitted each other at front-end portions thereof whose thicknesses are small.

Because of this, even in a case where error in the size of the substrate 11 (refer to FIGS. 5A and 5B) or a mask occurs, in case where the mask is obliquely attached to the substrate 11, or the like, the front-end face of the first extending section 250 is not in contact with (not collides against) the front-end face of the second extending section 252.

For this reason, the first extending section 250 is easily disposed between the second extending section 252 and the step-difference section 251, and the second extending section 252 is easily disposed under the back face side of the first extending section 250.

Consequently, the first extending section 250 and the second extending section 252 are surely stacked.

Therefore, since the particles of the film forming material are not intruded while passing through the space between adjacent masks 240a and 240b, the particles of the film forming material are not scattered to the space above the top face 11b while passing through the space formed between the masks 240a and 240b.

That is, it is possible to suppress adherence of the particles of the film forming material to the side face or the top face 11b of the substrate 11.

Fifth Embodiment

Figure 10:
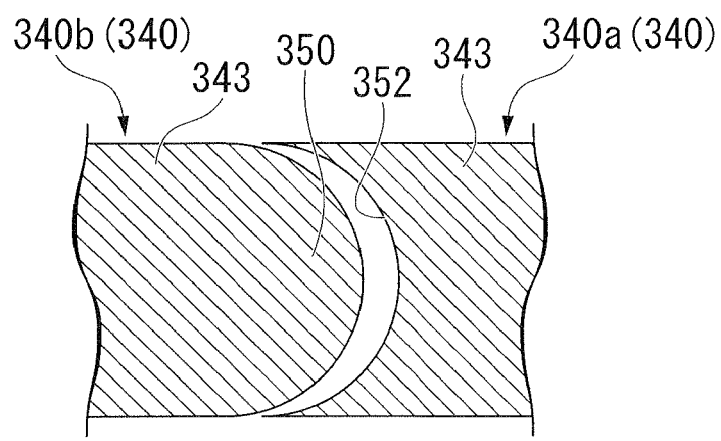
FIG. 10 is an enlarged cross-sectional view showing the constitution of a superposed section of a mask of a fifth embodiment of the invention.

Additionally, as shown in FIG. 10, the superposed section is constituted of a protuberance portion 350 and a recessed portion 352.

The protuberance portion 350 is a portion at which a downstream side face of a peripheral wall 343 protrudes toward the downstream side.

The recessed portion 352 is a portion at which an upstream side face of the peripheral wall 343 is depressed.

The protuberance portion 350 protrudes so that the front-end face thereof is curved, and the cross-sectional configuration thereof is a semicircular form.

On the other hand, the recessed portion 352 is concave so that the inner surface thereof is curved and can receive the protuberance portion 350.

Consequently, when a plurality of masks 340 are arranged in the lateral direction thereof in a tandem arrangement, the protuberance portion 350 of the peripheral wall 343 constituting mask 340b disposed at the rear position (left side in FIG. 10) is disposed at the recessed portion 352 of the peripheral wall 343 constituting the mask 340a disposed at the front position (right side in FIG. 10) in the description on page 37, lines 20 to 23.

Therefore, the superposed section is formed and arranged so that the peripheral walls 343 of each of adjacent masks are stacked as seen from the thickness direction thereof.

With this configuration, even in a case where the position of the mask 340a is out of alignment with respect to the position of the mask 340b in a normal line direction of mask 340 due to vibration or the like occurring during transferring of the substrate, since both sides (upper side and lower side) of the protuberance portion 350 is covered with both end portions (front-end portion) of the recessed portion 352 in the thickness direction thereof, it is possible to reliably suppress the displacement between the position of the mask 340a and the position of the mask 340b.

Sixth Embodiment

The configuration of the above-described protuberance portion 350 and the recessed portion 352 is not limited to a curved shape as shown in FIG. 10. Modifications of the shape can be appropriately adopted.

Figure 11:
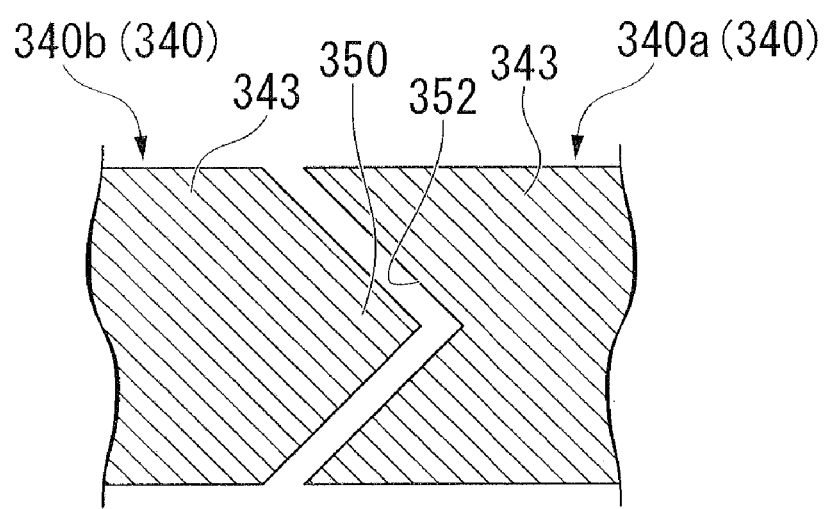
FIG. 11 is an enlarged cross-sectional view showing the constitution of a superposed section of a mask of a sixth embodiment of the invention.

For example, as shown in FIG. 11, the superposed section in the cross-sectional shape thereof may be a triangular shape.

Specifically, the superposed section has a protuberance portion 350 formed in a triangular shape in the cross-sectional configuration and a recessed portion 352 formed in a triangular shape in the cross-sectional configuration.

The protuberance portion 350 is formed at a downstream side face of the peripheral wall 343, and protrudes so that the end of the protuberance portion 350 gradually thins down in a manner so as to approach the front-end (downstream side).

The recessed portion 352 is formed at an upstream side face of the peripheral wall 343, the inner surface thereof is formed in a triangular shape in the cross-sectional configuration. The recessed portion 352 can receive the protuberance portion 350.

In addition, as long as the superposed section is configured so that adjacent masks overlap each other, a protuberance portion may be formed at the upstream side face of the peripheral wall of the mask, and a recessed portion may be formed at the downstream side face. A recessed portion may be formed at the upstream side face, or a protuberance portion may be formed at the downstream side face.

Additionally, the superposed section shown in the above-described embodiment may have a constitution in which an insulating element may be disposed between an upstream mask and a downstream mask.

Structures in which an insulating element is provided at the superposed section will be described in the seventh to eleventh embodiments.

Seventh Embodiment

Figure 12A:
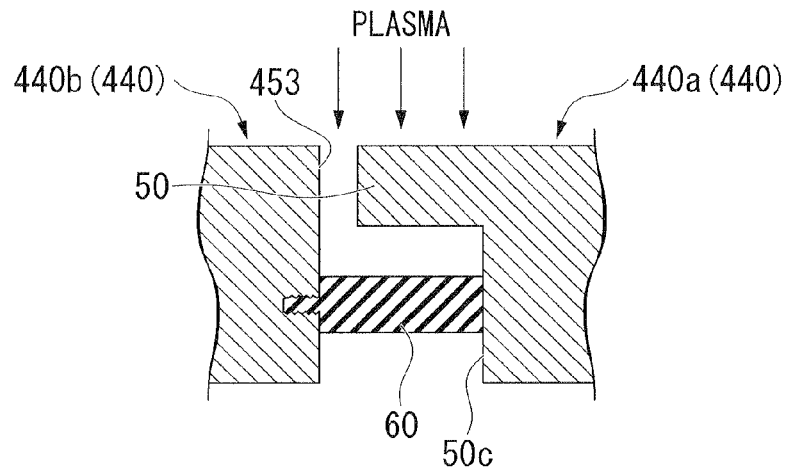
FIG. 12A is an enlarged cross-sectional view showing the constitution of a superposed section of a mask of a seventh embodiment of the invention.

As shown in FIG. 12A, the superposed section is constituted of the first extending section 50 and an insulating member 60 and is located between the mask 440a and the mask 440b.

As described in the first embodiment, the first extending section 50 extends toward the upstream side along an upper face of the mask body of the mask 440a.

The insulating member 60 is composed of a known insulation material and is provided at a downstream edge face 453 of the mask 440b by screw fixation.

In other cases, a screw portion may be provided at the insulating member 60 and the insulating member 60 may be fixed and screwed into the mask.

Additionally, the portion positioned under the first extending section 50 is a step-difference section 50c.

The first extending section 50 and the insulating member 60 are disposed between the mask 440a and the mask 440b so that the insulating member 60 faces the step-difference section 50c and the first extending section 50 also faces the edge face 453.

Moreover, the first extending section 50 and the insulating member 60 are extended in the direction perpendicular to the direction in which the substrate is transferred, that is, in the direction of the width W2 of the mask shown in FIG. 4.

In addition, the insulating member 60 is not in contact with the step-difference section 50c in FIG. 12A, but the insulating member 60 may be in contact with the step-difference section 50c.

As described above, even in a case where the superposed section is constituted of the first extending section 50 and the insulating member 60, it is possible to suppress adherence of the particles of the film forming material to the side face or the top face 11b of the substrate 11 in the same manner as in the above-described embodiment.

In addition to this effect, since the insulating member 60 is provided at the superposed section in the embodiment, it is possible to prevent leakage current between the mask 440a and the mask 440b from being generated.

In other cases, as described below, a structure using the insulating member 60 may be applied to the superposed section shown in FIGS. 5B, 9, 10, and 11.

Eighth Embodiment

Figure 12B:
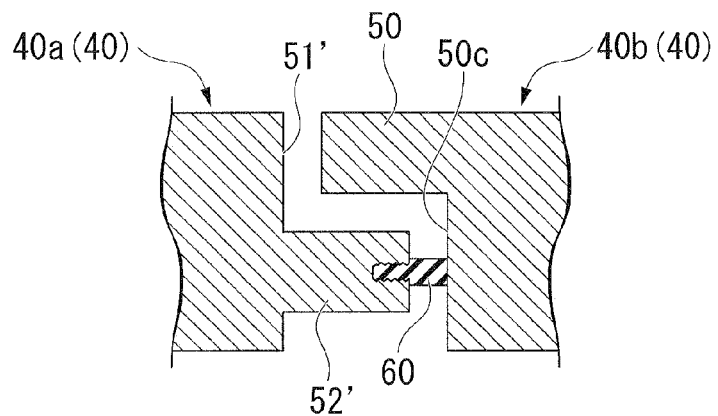
FIG. 12B is an enlarged cross-sectional view showing the constitution of a superposed section of a mask of an eighth embodiment of the invention.

As shown in FIG. 12B, the superposed section is provided between the mask 40a and the mask 40b and is constituted of the first extending section 50, the second extending section 52', and the insulating member 60.

The constitutions of the first extending section 50 and the second extending section 52' are the same as the structure described in the first embodiment.

The insulating member 60 is provided at the front-end of the second extending section 52'.

Additionally, the insulating member 60 is in contact with the step-difference section 50c positioned under the first extending section 50.

As described above, even in a case where the superposed section is constituted of the first extending section 50, the second extending section 52', and the insulating member 60, it is possible to prevent leakage current from being generated between the mask 40a and the mask 40b.

Ninth Embodiment

Figure 12C:
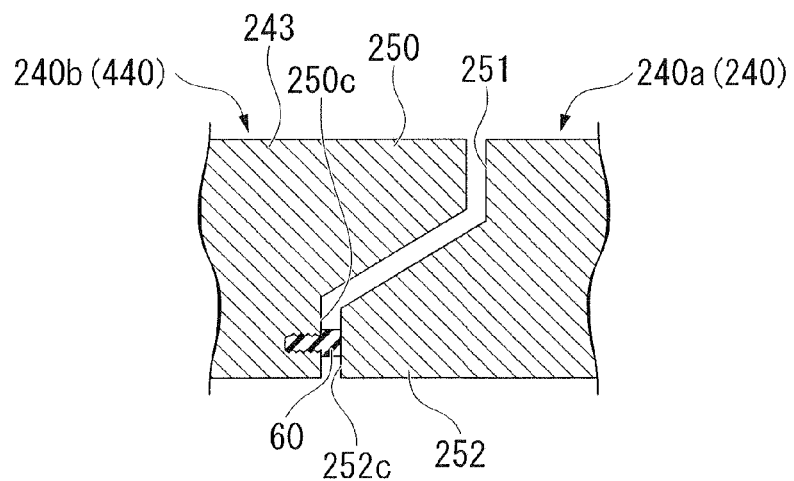
FIG. 12C is an enlarged cross-sectional view showing the constitution of a superposed section of a mask of a ninth embodiment of the invention.

As shown in FIG. 12C, the superposed section is provided between the masks 240a and 240b and is constituted of the first extending section 250, the second extending section 252, and the insulating member 60.

The constitutions of the first extending section (protuberance portion) 250 and the second extending section 252 are the same as the constitutions described in the fourth embodiment.

The insulating member 60 is provided at an edge face 250c positioned under the first extending section 250 so as to face a front-end face 252c of the second extending section 252.

As described above, even in a case where the superposed section is constituted of the first extending section 250, the second extending section 252, and the insulating member 60, it is possible to prevent leakage current between the masks 240a and 240b from being generated.

Tenth Embodiment

Figure 12D:
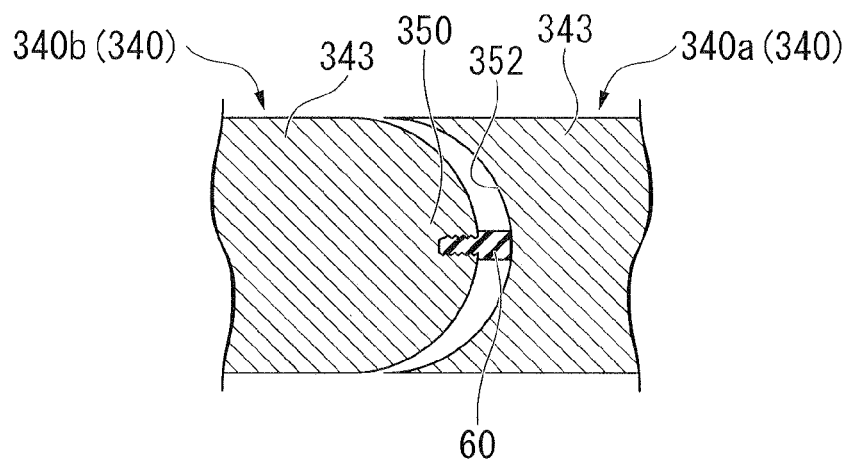
FIG. 12D is an enlarged cross-sectional view showing the constitution of a superposed section of a mask of a tenth embodiment of the invention.

As shown in FIG. 12D, the superposed section is provided between the masks 340a and 340b and is constituted of the protuberance portion 350, the recessed portion 352, and the insulating member 60.

The constitutions of the protuberance portion 350 and the recessed portion 352 are the same as the constitutions described in the fifth embodiment.

The insulating member 60 is provided at the front-end portion of the protuberance portion 350 to face a central portion of the recessed portion 352.

As described above, even in a case where the superposed section is constituted of the protuberance portion 350, the recessed portion 352, and the insulating member 60, it is possible to prevent leakage current between the masks 340a and 340b from being generated.

Eleventh Embodiment

Figure 12E:
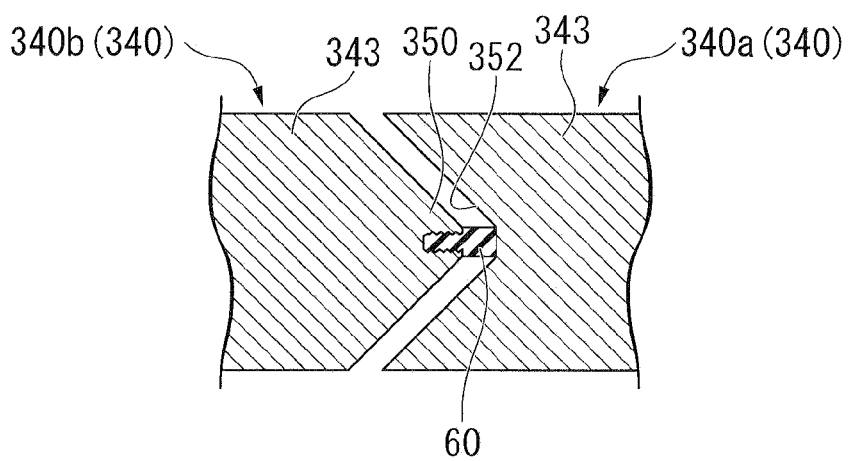
FIG. 12E is an enlarged cross-sectional view showing the constitution of a superposed section of a mask of an eleventh embodiment of the invention.

As shown in FIG. 12E, the superposed section is constituted of the protuberance portion 350 formed in a triangular shape in the cross-sectional configuration, the recessed portion 352 formed in a triangular shape in the cross-sectional configuration, and the insulating member 60.

The constitutions of the protuberance portion 350 and the recessed portion 352 are the same as the constitutions described in the sixth embodiment.

The insulating member 60 is provided at the front-end portion of the protuberance portion 350 so as to face the central portion of the recessed portion 352.

As described above, even in a case where the superposed section is constituted of the protuberance portion 350, the recessed portion 352, and the insulating member 60, it is possible to prevent leakage current between the masks 340a and 340b from being generated.

Additionally, the case where adjacent masks are arranged so as to form a tandem arrangement is described in the above-described embodiment, but the invention may be applied to a case of using one mask.

In this case, since a peripheral wall covering a side face of a substrate and a superposed section extending from a side face of a peripheral wall are formed at a side portion of a mask body, it is possible to prevent the particles of the film forming material from being adhered to the top face 11b while scattering to the space above the top face 11b.

Additionally, in the above-described embodiment, an amorphous silicon type solar cell and a method for manufacturing the solar cell are described, but, the invention is applicable to a microcrystalline silicon type solar cell or crystalline silicon (single-crystalline silicon, polysilicon) type solar cell and a method of manufacturing the solar cell.

Furthermore, in above-described embodiment, a single type solar cell is described, but, the invention is applicable to a method for manufacturing a tandem-type solar cell in which an amorphous silicon and a microcrystalline silicon are held between a pair of electrodes.

In the tandem-type solar cell, since a first semiconductor layer (for example, amorphous silicon) absorbs a short-wavelength light and a second semiconductor layer (for example, microcrystalline silicon) absorbs a long-wavelength light, it is possible to improve the power generation efficiency.

In the method for manufacturing an amorphous silicon type solar cell, the mask of the invention can be used in a film formation step using a CVD method.

Moreover, due to providing an intermediate electrode between semiconductor layers, part of light that passed through one of semiconductor layers and reaches the other of semiconductor layers is reflected by the intermediate electrode and re-enters to one of semiconductor layers, the sensitivity characteristics of the photoelectric converter is improved, and the intermediate electrode contributes improvement of the power generation efficiency.

INDUSTRIAL APPLICABILITY

As described in detail, the invention is applicable to a mask and a film formation method using the mask where the particles of the film forming material are prevented from being adhered to a non-film formation region of one face of the substrate (face on which a film is to be formed, first face), the particles of the film forming material are prevented from scattering to the other face or a side face of the substrate (non-film formation face, second face), and it is thereby possible to improve manufacturing efficiency.

What is claimed is:

1. A mask comprising:
  a tabular first section which includes a side portion and an opening portion formed at a position corresponding to a film formation region of a substrate and on which the substrate is to be disposed so that the first section overlaps a face of the substrate on which a film is to be formed; and
  a second section which is provided along the side portion of the first section, and covers at least one of portions of a side face of the substrate, wherein when a plurality of masks are arrayed in a lateral direction thereof, second sections of two adjacent masks overlap each other, and a superposed section is thereby formed.

2. The mask according to claim 1, wherein the superposed section has a protuberance portion extending from the second section toward a first direction and a recessed portion extending toward a second direction which is opposite to the first direction; and
  when a plurality of the masks are arrayed in a lateral direction thereof, the protuberance portion and the recessed portion are mutually combined and overlap each other as seen from a normal line direction of the substrate.

3. The mask according to claim 2, wherein an insulating member is provided between two masks adjacent to each other in the superposed section.

4. A film formation method comprising:
  preparing a plurality of masks, each mask including: a tabular first section which includes a side portion and an opening portion formed at a position corresponding to a film formation region of a substrate and on which the substrate is to be disposed so that the first section overlaps a face of the substrate on which a film is to be formed; and a second section which is provided along the side portion of the first section, and covers at least one of portions of a side face of the substrate, second sections of two masks that are adjacent to each other overlapping each other when a plurality of masks are arrayed in a lateral direction thereof, and a superposed section being thereby formed;
  attaching the substrate to each of the masks; and
  continuously transferring a plurality of substrates to a film forming chamber, and thereby forming a film on the substrates.

5. The film formation method according to claim 4, wherein the superposed section comprises a protuberance portion extending in a first direction from the second section and a recessed portion extending in a second direction opposite to the first direction;
  When a film is formed on a plurality of the substrates, a plurality of the masks are arrayed in a lateral direction thereof, the protuberance portion and the recessed portion are mutually combined and overlap each other as seen from a normal line direction of the substrate.

6. The film formation method according to claim 4, wherein a photoelectric conversion layer of a solar cell is formed on the substrate;
  the mask is attached to each of the substrates on which the photoelectric conversion layer is formed; and
  a plurality of the substrates are continuously transferred to the film forming chamber, and a back-face electrode is formed on the photoelectric conversion layer of the substrates.

* * * * *